(12) United States Patent
Palangappa et al.

(10) Patent No.: US 11,063,607 B2
(45) Date of Patent: Jul. 13, 2021

(54) COMPRESSING ERROR VECTORS FOR DECODING LOGIC TO STORE COMPRESSED IN A DECODER MEMORY USED BY THE DECODING LOGIC

(71) Applicant: INTEL CORPORATION, Santa Clara, CA (US)

(72) Inventors: Poovaiah M. Palangappa, San Jose, CA (US); Zion S. Kwok, Vancouver (CA)

(73) Assignee: Intel Corporation, Santa Clara, CA (US)

( * ) Notice: Subject to any disclaimer, the term of this patent is extended or adjusted under 35 U.S.C. 154(b) by 81 days.

(21) Appl. No.: 16/422,891

(22) Filed: May 24, 2019

(65) Prior Publication Data

US 2019/0280715 A1 Sep. 12, 2019

(51) Int. Cl.
*H03M 13/11* (2006.01)
*H03M 7/30* (2006.01)
*H03M 13/37* (2006.01)
*H03M 13/00* (2006.01)

(52) U.S. Cl.
CPC ..... *H03M 13/1108* (2013.01); *H03M 7/6005* (2013.01); *H03M 13/3746* (2013.01); *H03M 13/6577* (2013.01)

(58) Field of Classification Search
CPC ........... H03M 13/1108; H03M 7/6005; H03M 13/3746; H03M 13/6577
See application file for complete search history.

(56) References Cited

U.S. PATENT DOCUMENTS

| 5,636,231 | A | * | 6/1997 | Huang | ..................... G10L 19/07 375/240 |
| 9,250,990 | B2 | * | 2/2016 | Motwani | ............. G06F 11/1048 |
| 2004/0218440 | A1 | * | 11/2004 | Kumar | .................... G11C 29/16 365/202 |
| 2011/0138253 | A1 | * | 6/2011 | Gunnam | ............ H03M 13/1142 714/773 |

OTHER PUBLICATIONS

Ercan, F., et al., "Improved Bit-Flipping Algorithm for Successive Cancellation Decoding of Polar Codes", arXiv:1808.03616v2 [cs.IT], Sep. 26, 2018, 12 pp.
(Continued)

*Primary Examiner* — Cynthia Britt
(74) *Attorney, Agent, or Firm* — Compass IP Law PC (57) ABSTRACT

Provided are an apparatus, storage device, and method for compressing error vectors for decoding logic to store compressed in an decoder memory used by the decoding logic. A decoder decodes codewords to produce error vectors used to decode the codewords. A decoder memory device stores the error vectors. A compression unit receives the error vector from the decoder during decoding of the codeword. Each bit in the error vector has one of a first value and a second value. A determination is made of at least one bit location in the error vector having the first value. At least one pointer is stored in a row of memory cells in the decoder memory device indicating the determined at least one bit location in the codeword having the first value.

25 Claims, 5 Drawing Sheets

(56) References Cited

OTHER PUBLICATIONS

Huang, Q., et al., "Cyclic and Quasi-Cyclic LDPC Codes on Row and Column Constrained Parity-Check Matrices and Their Trapping Sets", arXiv:1012.3201v1 [cs.IT], Submitted to IEEE Transactions on Information Theory, Dec. 15, 2010, 71 pp.

Ishikawa, T., et al., "High-Throughput Decoder for Low-Density Parity-Check Code", In Proceedings of the Asia and South Pacific Conference on Design Automation, Jan. 2006, 2 pp.

Zhong, H., et al., "Quasi-Cyclic LDPC Codes for the Magnetic Recording Channel: Code Design and VLSI Implementation", IEEE Transactions on Magnetics, vol. 43, No. 3, Mar. 2007, 6 pp.

Zhou, X., et al., "Improved Iterative Bit Flipping Decoding Algorithms for LDPC Convolutional Codes", In Proceedings of the 2007 IEEE Pacific Rim Conference on Communications, Computers and Signal Processing, Aug. 2007, 4 pp.

U.S. Appl. No. 16/370,178, filed Mar. 29, 2019, 53 pp.

\* cited by examiner

COMPRESSING ERROR VECTORS FOR DECODING LOGIC TO STORE COMPRESSED IN A DECODER MEMORY USED BY THE DECODING LOGIC

TECHNICAL FIELD

Embodiments described herein generally relate to an apparatus, storage device, and method for compressing error vectors for decoding logic to store compressed in an decoder memory used by the decoding logic.

BACKGROUND

A solid state drive (SSD) may be comprised of multiple NAND dies. Data may be encoded and stored as codewords, such as Low-Density Parity-Check (LDPC) codewords, which typically include data bytes and parity bytes in one or more NAND pages in one or more NAND dies. If one or more of the NAND pages has bit errors, then parity-check sums may be calculated based on the codeword bits read from the NAND page or pages, and a decode operation can correct the bit errors in most cases.

An SSD controller decodes the LDPC codewords to correct any errors in the codewords. To decode the codeword, a low-density parity-check (LDPC) H matrix is coded in the decoder and provides connections between variable/bit nodes at which the code word is loaded and check nodes. The variable/bit nodes correspond to the matrix columns and codeword bits and the check nodes correspond to the matrix rows and syndrome bits. The codeword read from the NAND dies is loaded into variable/bit nodes, which outnumber the check nodes. The decoder calculates check node values by computing a syndrome by multiplying the values of the variable/bit nodes by the H matrix. In different types of LDPC decoding (e.g. min-sum, bit flipping, belief propagation), messages are passed between the variable/bit nodes and check nodes over multiple iterations until a codeword is found such that the check nodes contain all 0s indicating a zero syndrome value, which corresponds to variable/bit nodes containing the corrected codeword.

There is a need in the art for improved techniques for decoding a codeword for error correction.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

In order to decode an LDPC codeword, a Static Random Access Memory (SRAM) is typically used to store intermediate data generated by the decoder during decoding iterations, such as an error vector indicating bits in the codeword to flip to eliminate errors, resulting in a zero syndrome value. There is a need in the art to minimize the profile of the decoder SRAM to reduce power consumption, heat generation, silicon area, and cost.

Described embodiments provide improvements to decoder computer technology to decode codewords from a storage device by allowing for the deployment of a smaller profile decoder memory, such as an SRAM. Described embodiments utilize compression to compress the error vectors generated by the decoder during iterations of the decoding operation to require fewer memory cells per row to store the error vectors. The compression technique of the described embodiments allows for a limited size decoder memory due to the sparse number of one bits in an error vector generated during decoding iterations that indicate bit locations in a codeword to flip. The width of the rows of the memory device may have only a minimum number of memory cells sufficient to store a maximum number of pointers to bit locations in the error vector having the sparse one value a high percentage of the time, such as 99% of the time. If an error vector requires a number of pointers more than the maximum number of pointers, that can be stored in one row of memory cells, which occurs less than 1% of the time, then a next row of memory cells may provide overflow for pointers for the error vector that could not be stored in the previous row of memory cells.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage devices electronic assemblies. Embodiments include both devices and methods for forming electronic assemblies.

Figure 1:
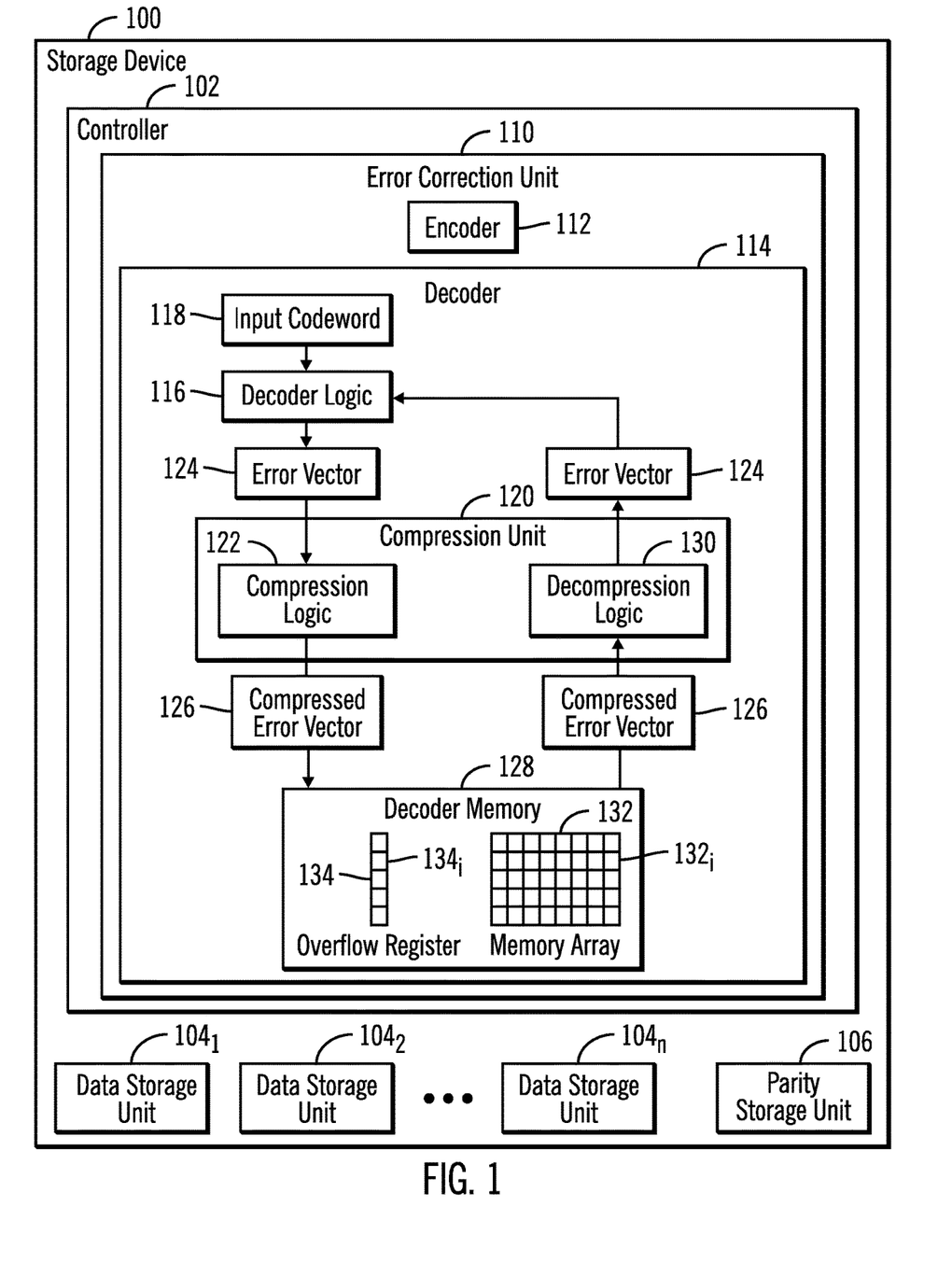
FIG. 1 illustrates an embodiment of a storage device.

FIG. 1 illustrates an embodiment of a storage device 100, such as a solid state drive (SSD), including a non-volatile memory controller 102 to perform read, write and error recovery (also known as error correction) operations with respect to a memory storage array comprising data storage units 104$_1$, 104$_2$ ... 104$_n$ and a parity storage unit 106 having XOR parity data to perform parity error recovery if one the data storage units 104$_1$, 104$_2$ ... 104$_n$ fails.

In one embodiment, the storage units 104$_1$, 104$_2$ ... 104$_n$, 106 may comprise electrically erasable and non-volatile memory cells, such as flash storage devices. For instance, storage units 104$_1$, 104$_2$ ... 104$_n$, 106 may comprise NAND dies of flash memory cells. In one embodiment, the NAND dies may comprise a multilevel cell (MLC) NAND flash memory that in each cell records two bit values, a lower bit value and an upper bit value. Alternatively, the NAND dies may comprise single level cell (SLC) memories or three bit per cell (TLC) memories. The storage units $104_1$, $104_2$ ... $104_n$, 106 may also comprise, but are not limited to, non-volatile types of memory that may include byte or block addressable types of non-volatile memory having a 3-dimensional (3-D) cross-point memory structure that includes, but is not limited to, chalcogenide phase change material (e.g., chalcogenide glass) hereinafter referred to as "3-D cross-point memory". Non-volatile types of memory may also include other types of byte or block addressable non-volatile memory such as, but not limited to, multi-threshold level NAND flash memory, NOR flash memory, single or multi-level phase change memory (PCM), resistive memory, nanowire memory, ferroelectric transistor random access memory (FeTRAM), anti-ferroelectric memory, resistive memory including a metal oxide base, an oxygen vacancy base and a conductive bridge random access memory (CB-RAM), a spintronic magnetic junction memory, a magnetic tunneling junction (MTJ) memory, a domain wall (DW) and spin orbit transfer (SOT) memory, a thyristor based memory, a magneto resistive random access memory (MRAM) that incorporates memristor technology, spin transfer torque MRAM (STT-MRAM), or a combination of any of the above.

The controller 102 includes an error correction unit 108 having an encoder 112 to use Low-Density Parity-Check (LDPC) encoding algorithms to encode data to write to memory cells of the storage units $104_1$, $104_2$ ... $104_n$, 106 in a manner to maximize the probability of the data being accurately recovered. The controller 102 also includes a decoder 114 that may use LDPC decoding algorithms to decode codewords from the storage units $104_1$, $104_2$ ... $104_n$, 106. The decoder 114 includes decoder logic 116 to perform the decoding of codewords 118 read from the storage units $104_1$, $104_2$ ... $104_n$, 106 and a compression unit 120. An input codeword 118 to decode includes both data and parity information. The compression unit 120 has compression logic 122 to compress error vectors 124 produced by the decoder logic 116 during iterations of decoding the input codeword 118 to store a compressed error vector 126 in a decoder memory 128 and decompression logic 130 to decompress a compressed error vector 126 read from the decoder memory 128 to return to the decoder logic 116. The term "compression unit" as used herein may refer to the compression logic 122 and/or a combination of compression logic 122 and the decompression logic 130. The term "decompression unit" as used herein may refer to the decompression logic 130 and/or a combination of compression logic 122 and the decompression logic 130.

The decoder memory 128 includes a memory array 132 having rows $132_i$ of memory cells in which the compressed error vectors 126 are stored and an overflow register 134 having a bit $134_i$ for each row $132_i$ in the memory array 132 indicating whether a next row $132_{i+1}$ in the memory array 132 has overflow information for the compressed error vector 126. In one embodiment, the decoder memory 128 may comprise a Static Random Access Memory (SRAM), or other suitable volatile or non-volatile memory devices. In one embodiment, decoder logic 116 may use LDPC codes to decode, which uses a parity-check matrix (aka H matrix) to compute the syndrome (error signature consisting of a bit vector) for a noisy codeword. Any codeword whose syndrome is zero is considered to be a valid codeword. The decoder logic 116 decodes by iteratively moving from a noisy codeword (syndrome is not all zeros) to a corrected codeword (syndrome is all zeros).

The decoder logic 116 may implement decoding algorithms such as bit-flip decoder, layered decoder, sum-product decoders, belief-propagation decoders, etc. In an embodiment where the decoder logic 116 comprises a bit-flip (BF) decoder, messages (reliabilities) from connected bits (neighbors) are used to evaluate the reliabilities of a given check node. A BF decoder progressively flips the input bits (variable nodes) depending on the number of satisfied check nodes (a measure of the bits correctness). This iterative bit flipping can result in a zero-syndrome (meaning, all the check nodes are satisfied), which marks the end of the decoding. If after a fixed maximum number of iterations, the syndrome is not zero, then the decoding may fail. If decoding fails, then secondary decode paths can be used to further the error correction capability. The secondary decode paths may comprise decoders having higher error correction capability, obtain further reliability information from the media, or obtain more parity bits from the media, etc. Typically, such secondary decode paths incur higher latencies to decode. With a BF decoder, a large fraction of the incoming data can be quickly decoded and only a very small fraction needs the support of the more powerful slow decoder.

In an embodiment where the decoder logic 116 comprises a min-sum (MS) decoder or a sum-product algorithm (SPA) decoder, messages (reliabilities) from connected bits (neighbors) are used to evaluate the reliabilities of a given check node. A MS decoder progressively flips the input bits (variable nodes) depending on the messages passed between variable nodes and check nodes. This iterative decoding can result in a zero-syndrome (meaning, all the check nodes are satisfied), which marks the end of the decoding. If after a fixed maximum number of iterations, the syndrome is not zero, then the decoding may fail. If decoding fails, the codeword may be re-read from the NAND page or pages, and another decode operation attempted.

FIG. 1 shows the decoder 114 used in the context of decoding codewords stored in data storage units $104_i$ and a parity storage unit 106. In alternative embodiments there may be any number of data storage units $104_i$ and parity storage units 106 for the data storage units $104_i$. In one embodiment, one memory device can comprise the data storage units $104_i$ and parity storage unit 106. In further embodiments, there could be thirty-two data storage units $104_i$ and eight parity storage units 106. In yet further embodiments, there may be no data storage and parity units, such as when the decoder 114 is used to decode data that was transmitted over wireless and optical communication media.

Figure 2:
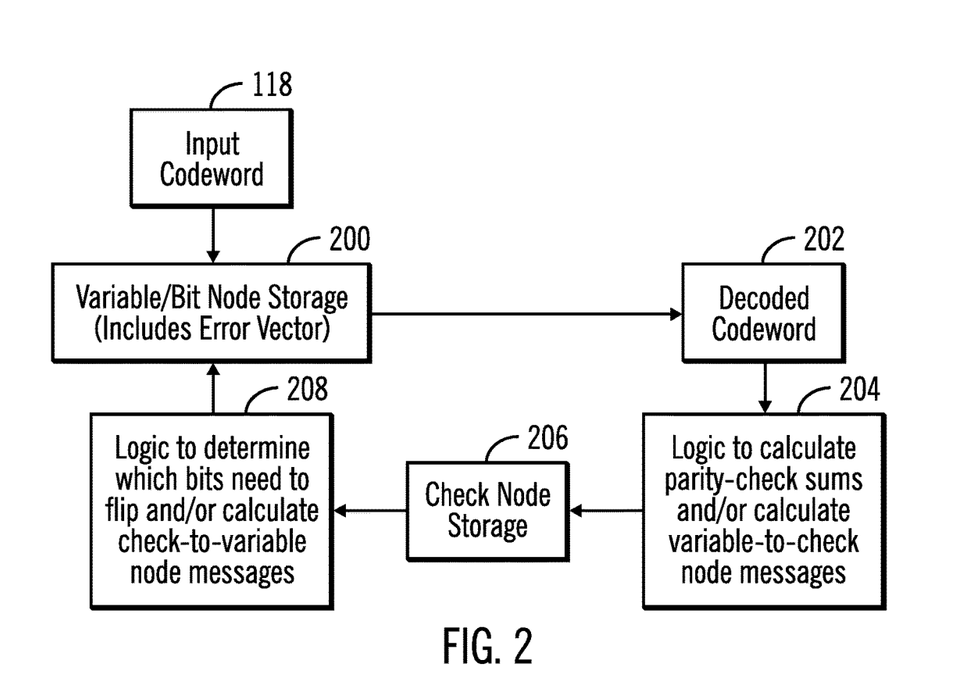
FIG. 2 illustrates an embodiment of decoder operations.

FIG. 2 illustrates an embodiment of the decoding by the decoder logic 116, where the input codeword 118 (data and parity read from the storage units $104_i$ and 106) is introduced to variable/bit node storage (includes error vector) 200 to produce a decoded codeword 202. The decoded codeword 202 is forwarded to logic (e.g., hardware circuits) to calculate parity-check sums and/or calculate variable-to-check node messages 204. The parity-check sums and/or check node messages are sent to check node storage 206. The parity-check sums and/or variable-to-check node messages in the check node storage 206 are sent to logic to determine which bits need to flip and/or calculate check-to-variable node messages 208. The determined bits to flip and/or check-to-variable node messages are then forwarded back to the variable/bit node storage 200 for further processing if the syndrome, or bits needed to flip, indicates bits still need to be flipped. If processing continues the error vector 124 is stored in the variable/bit node storage 200 to use in further decoder logic 116 processing.

In a further embodiment, the decoder logic 116 may split the decoding iterations into multiple sub-iterations to process multiple bits, where each bit corresponds to a column in the H matrix. To speed up the process, the decoder logic 116 may process S bits, or speed-up bits, to increase throughput. This arrangement may determine the geometry of the decoder memory 128, such as an SRAM, used to store the bit flip or error vector. For an example decoder that processes S=1216 bits of an H matrix with 38912 columns over 32 clock cycles would require an SRAM of width 1216 and depth 32 for the uncompressed error vectors. Such an SRAM would be quite shallow, a depth of 32 versus a width of 1216, and requires a higher area per bit of storage than typical SRAM geometries.

To further reduce the size of the decoder memory 128 (SRAM), the error vector 124 may be compressed by only storing pointers indicating bit locations in the error vector 124 having one values. Because the error vector 124 to store may be compressed by only storing pointers to the bit locations having ones, the rows $132_i$ do not need memory cells to represent all bits, e.g., 1216, in an error vector 124, but need only have sufficient space to store the pointers to the bit locations having one. To determine how many memory cells in a row $132_i$ are needed to store pointers, a probability distribution function (PDF) and cumulative distribution function (CDF) graph of the number of ones in an error vector 124 as shown in FIG. 3 may be used to determine how many pointers, e.g., number of ones, are needed to indicate bit locations having a one.

Figure 3:
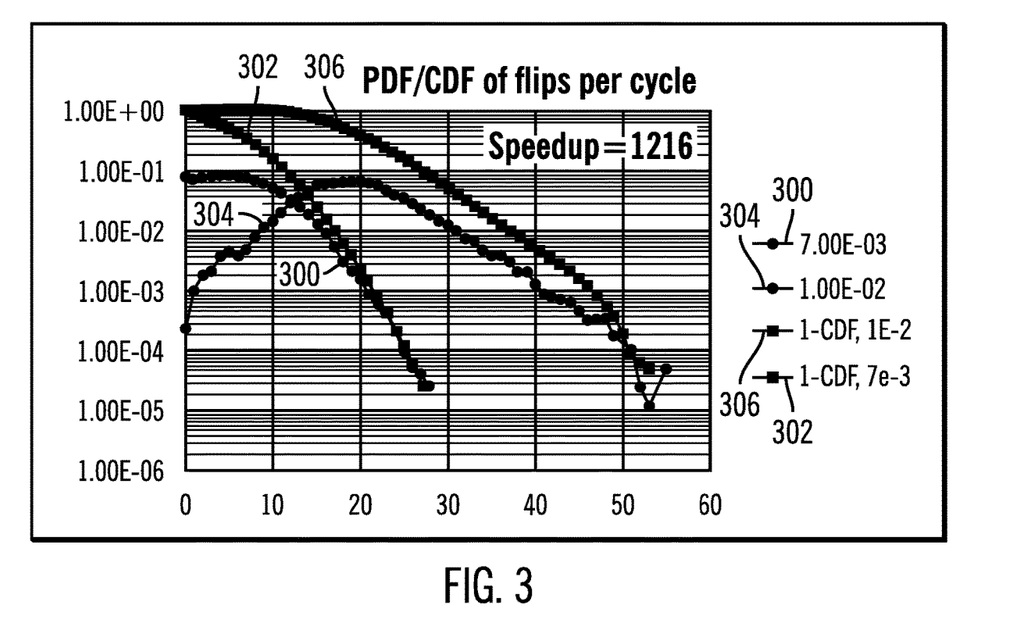
FIG. 3 illustrates an example of a probability distribution function and cumulative distribution function of the number of ones in a row of an error vector.

FIG. 3 shows the probability distribution of the number of bit locations in the error vector 124 having ones for decoders 114 having raw bit error rates (RBERs) of 7E-3 and 1E-2, where line 300 comprises the probability distribution function for an RBER of 7.00E-03, line 302 comprises the cumulative distribution function for an RBER of 7.00E-03 (where the CDF is plotted as 1-CDF), line 304 comprises the probability distribution function for an RBER of 1.00E-02, and line 306 comprises the cumulative distribution function for an RBER of 1.00E-02. For instance, although each error vector 124 can store 1216 ones, according to FIG. 3, 99% of the time only 16 or 37 locations (for RBER=7E-3 or 1E-2, respectively) are needed for the ones. 7E-3 is the typical max RBER supported by a BF decoder. Therefore, depending on the RBER of the decoder 114, in most cases the number of pointers needed to indicate bit locations having ones in an error vector 124 having 1216 bits is a limited number, e.g. 16 or 37.

For example, for a 1216 bit error vector 124, the number of bits each pointer needs to represent any bit location in the 1216 bit error vector 124 comprises a ceiling $(\log_2(1216+1)))=11$ bits. If it is determined from the probability distribution of the number of bit locations having ones 99% of the time is 30, then the SRAM row 132 must have sufficient memory cells to store 30 pointers, requiring 30*11 or 330 bits to have sufficient space to store pointers 99% of the time. In this way, the memory row $132_i$ may need only a quarter of the bits (330) of a 1216 bit error vector 124. This significantly reduces the number of memory cells in each row $132_i$ of the memory array 132, substantially reducing the width of the a decoder memory 128, such as an SRAM. If there are fewer ones than the maximum number of pointers, unused pointers may be given values that indicate an invalid bit location, such as $11111111111_2=2047$.

In those less than 1% of the times an error vector 124 has more than the maximum number of pointers, additional pointers beyond the maximum allowed in a row $132_i$ may be stored in a next row $132_{i+1}$ of the memory array 132 providing pointer overflow. When a row $132_i$ cannot indicate all bit locations having one in an error vector 124, the entry $134_i$ in the overflow register 134, corresponding to that row $132_i$ not having all the pointers for an error vector 124, is set to indicate the next row $132_{i+1}$ has further pointers for the error vector 124. To provide additional spare rows for overflow pointers, the decoder memory 128, such as an SRAM, may include a small number of extra rows of memory cells, such as 2% more rows, to accommodate rare occurrences, less than 1%, of an error vector 124 having a number of ones greater than the maximum number of pointers that may be stored in a row $132_i$.

Figure 4:
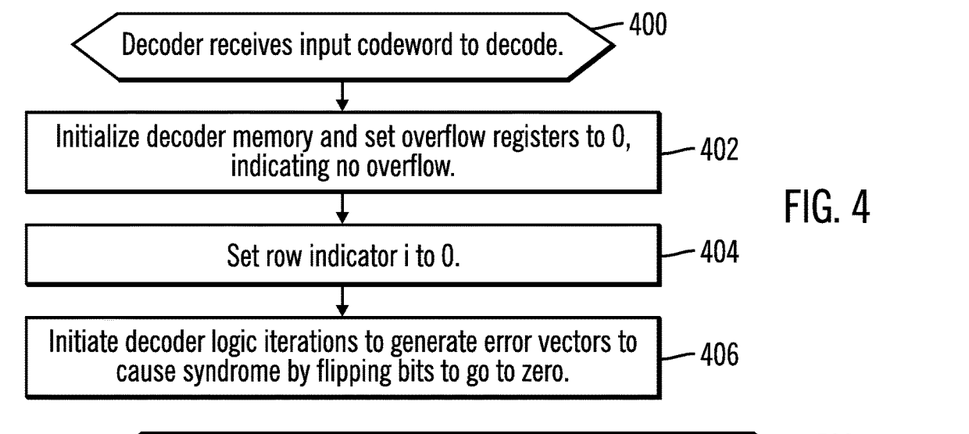
FIG. 4 illustrates an embodiment of operations for a decoder to initialize decoding of an input codeword.

FIG. 4 illustrates an embodiment of operations performed by the decoder logic 116 upon receiving an input codeword 118 to decode. Upon receiving (at block 400) the input codeword 118 (data and parity), the decoder logic 116 initializes (at block 402) the decoder memory 128 to set all rows $132_i$ in the memory array 132 and in the overflow register 134 to zero. A row indicator i is set (at block 404) to zero. The decoder logic 116 initiates (at block 406) iterations to decode the input codeword 118, which generates error vectors indicating bits to flip in the codeword 118 to eliminate errors. The error vectors 124 generated during the iterations include flip bits for different portions of the LDPC data and parity data for a codeword 118 over multiple sub-iterations, such that the error vector generation is split over multiple sub-iterations and stored in different rows $132_i$ of the memory array 132.

Figure 5:
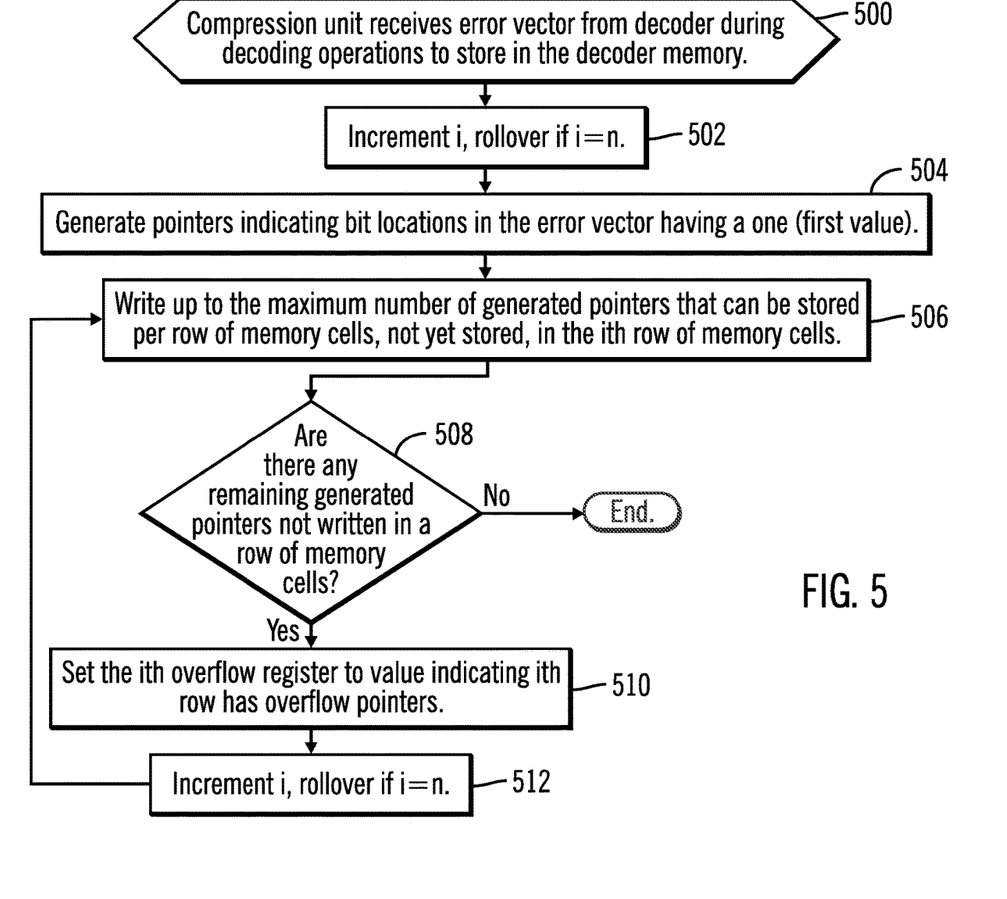
FIG. 5 illustrates an embodiment of operations to compress an error vector of a decoder to store in a decoder memory.

FIG. 5 illustrates an embodiment of operations performed by the compression logic 122 in the compression unit 120 to compress and store an error vector 124 from the decoder logic 116 generating during decoding operations to correct errors in the input codeword 118 to produce a syndrome of all zeroes. Upon receiving (at block 500) an error vector 124 from the decoder logic 116, the row indicator i is incremented (at block 502), or set to one if i is equal to the last row n in the memory array 132. Pointers are generated (at block 506) indicating bit locations in the received error vector 124 having a one, e.g., first value, indicating to flip the corresponding bit in the codeword 118 to correct errors. The compression logic 122 writes (at block 506) up to the maximum number of generated pointers that can be stored per row of memory cells $132_i$, not yet stored, in the ith row $132_i$ of memory cells. If (at block 508) there are any remaining generated pointers not written in the ith row $132_i$ of memory cells, then the ith overflow register $134_i$ is set (at block 510) to indicate that the next (i+1)th row $132_{i+1}$ in the memory array 132 has overflow pointers for the error vector 124 not written to a previous row $132_i$ in the memory array 132 having pointers for the error vector 124. The row indicator i is incremented (at block 512), or rolled over to 1 if the current row indicator is the last row of the memory array 132, and control proceeds back to block 506 to continue writing generated pointers for the error vector 124 to the next row $132_{i+1}$ in the memory array 132. If (at block 508) there are no remaining generated pointers not yet written, then control ends.

With the embodiment of FIG. 5, the compression logic 122 integrated with the decoder logic 116 compresses the error vectors that have a small sparse number of ones by only storing pointers to the bit locations of the one values, which requires less space in a row $132_i$ of the memory array than the space required to store the entire received error vector 124. This described embodiments allow for the deployment of a substantially smaller decoder memory 128, using less power, generating less heat, less silicon area, and having a lower cost than an SRAM used to store all the bits in an error vector 124.

Figure 6:
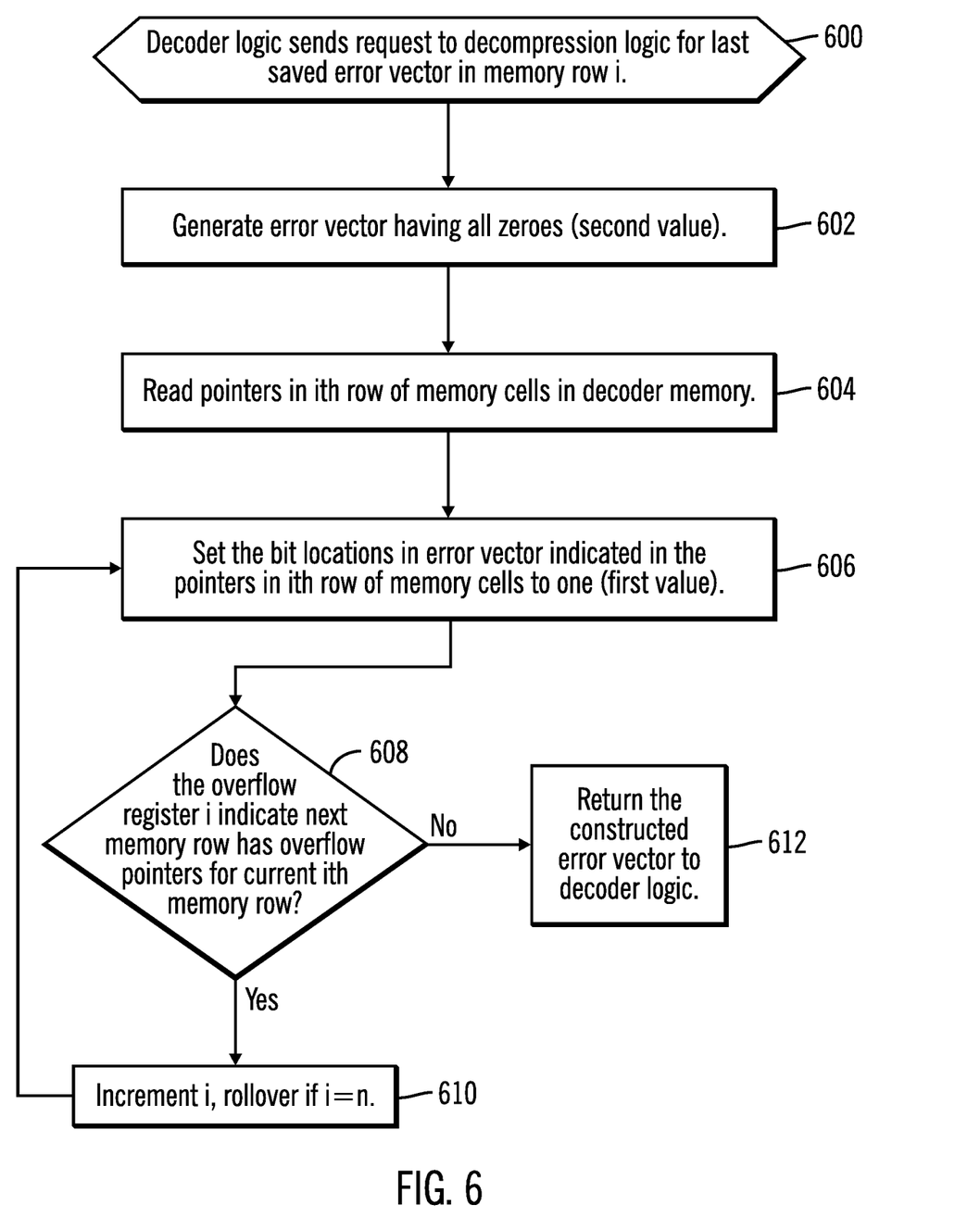
FIG. 6 illustrates an embodiment of operations to decompress an error vector stored in the error decoder memory.

FIG. 6 illustrates an embodiment of operations performed by the decompression logic 130 in response to a request from the decoder logic 116 for a compressed error vector 126 stored in the decoder memory 128. Upon receiving (at block 600) from the decoder logic 116 a request for an error vector from the decoder memory 128, which request may be specified by a memory address or the last row written, the decompression logic 130 generates (at block 602) an error vector 124 with all zeroes, e.g., the second value. The decompression logic 130 reads (at block 604) the compressed error vector 126 comprising pointers in the ith row $132_i$ of memory cells in the decoder memory 128. The bit locations indicated in the generated error vector 124 indicated in the read pointers in the ith row $132_i$ of memory cells is set (at block 606) to one. If (at block 608) the overflow register $134_i$ for the read ith memory row indicates overflow pointers for the read ith memory row $132_i$, then the row indicator i is incremented (at block 610) and control returns to block 604 to read the next row $132_{i+1}$ of memory for further pointers for the error vector being generated. If (at block 608) the overflow register entry $134_i$ for the read memory row $132_i$ does not indicate overflow pointers in the next memory row, then the constructed decompressed error vector 124 is returned to the decoder logic 116 to use during iterations of decoding operations.

With the embodiment of FIG. 6, the decompression logic 130 decompresses the error vector stored in the memory array 132 to return to the decoder logic 116 to use.

In the embodiments, the decoder memory 128 is used to store error vectors generated by the decoder logic 116. In alternative embodiments, the decoder memory 128 may be used to store other vectors and information used by the decoder logic 116 during decoding iterations and may not be limited to error vectors.

Figure 7:
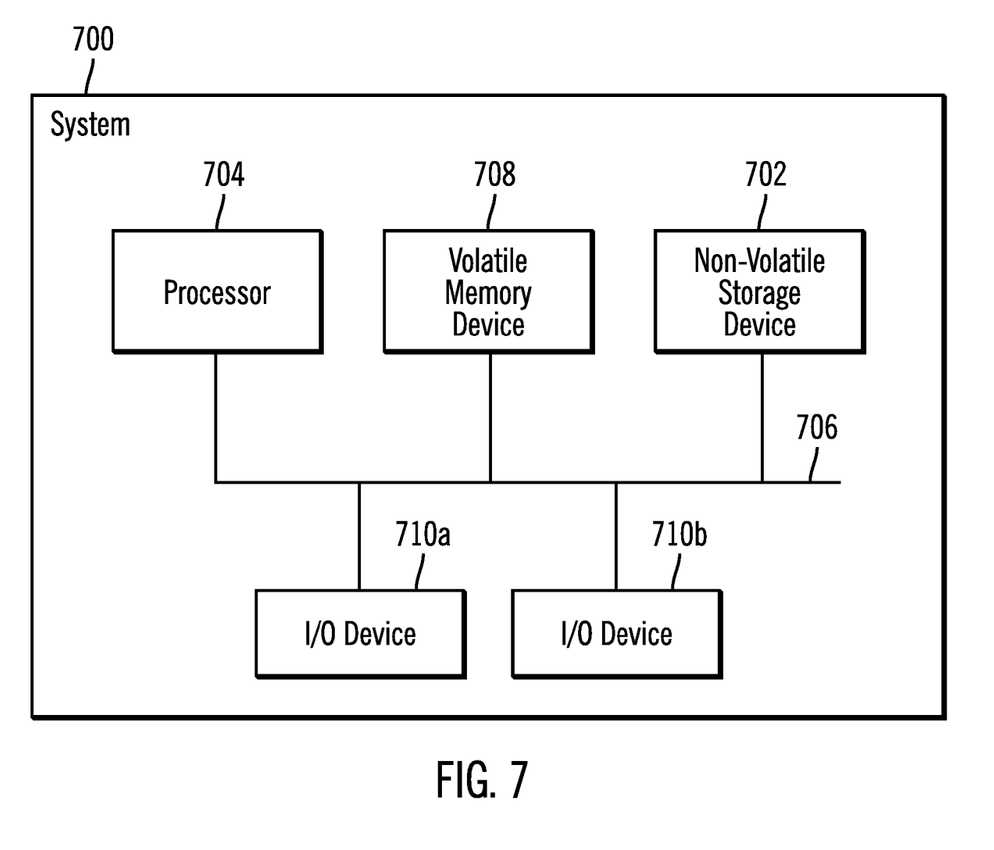
FIG. 7 illustrates a system in which the storage device of claim 1 may be deployed.

FIG. 7 illustrates an embodiment of a system 700 in which a non-volatile storage device 702, such as storage device 100 of FIG. 1, may be deployed. The system includes a processor 704 that communicates over a bus 706 with a volatile memory device 708 in which programs, operands and parameters being executed are cached and the non-volatile storage device 702, in which data and programs may be stored. The processor 704 may also communicate with Input/Output (I/O) devices 710a, 710b, which may comprise input devices, display devices, graphics cards, ports, network interfaces, etc. The non-volatile storage device 702 may be mounted to the system enclosure 700, such as in a storage drive bay, or connected to the system 700 through a port interface or over the network. The non-volatile storage device 702 may comprise random-access memory (RAM), Dynamic RAM (DRAM), double data rate synchronous dynamic RAM (DDR SDRAM), Dual In Line Memory Module (DIMM), static random-access memory (SRAM), thyristor RAM (T-RAM) or zero-capacitor RAM (Z-RAM).

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

The described operations of the controller 102 and the logic components 110, 112, 114, 116, 120, 122, 130, and other components, may be implemented as a method, apparatus or computer readable storage medium using standard programming and/or engineering techniques to produce software, firmware, hardware, or any combination thereof. The described operations may be implemented as code or logic maintained in a "computer readable storage medium", which may directly execute the functions or where a processor may read and execute the code from the computer storage readable medium. The computer readable storage medium includes at least one of electronic circuitry, storage materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The computer readable storage medium may further comprise digital logic implemented in a hardware device (e.g., an integrated circuit chip, a programmable logic device, a Programmable Gate Array (PGA), field-programmable gate array (FPGA), Application Specific Integrated Circuit (ASIC), etc.). A computer readable storage medium, as used herein, is not to be construed as being transitory signals, such as waves propagating through a waveguide or other transmission media or electrical signals.

Those skilled in the art will recognize that many modifications may be made to this configuration without departing from the scope of the present invention, and that the article of manufacture may comprise suitable information bearing medium known in the art.

EXAMPLES

The following examples pertain to further embodiments.

Example 1 is an apparatus for decoding data, comprising: a decoder to decode codewords to produce error vectors used to decode the codewords; a decoder memory device to store the error vectors; and a compression unit. The compression unit is to: receive the error vector from the decoder during decoding of the codeword, wherein each bit in the error vector has one of a first value and a second value; determine at least one bit location in the error vector having the first value; and store at least one pointer in a row of memory cells in the decoder memory device indicating the determined at least one bit location in the codeword having the first value.

In Example 2, the subject matter of Examples 1 and 3-11 can optionally include that the row of memory cells is configured to store a maximum number of pointers to bit locations in the error vector having the first value that is less than a number of bits in the error vector to compress the error vector in the row of memory cells.

In Example 3, the subject matter of Examples 1, 2 and 4-11 can optionally include that that the error vector has a sparse number of the first value.

In Example 4, the subject matter of Examples 1-3 and 5-11 can optionally include that the decoder memory device is configured such that the row of memory cells is of sufficient width to store the maximum number of pointers to bit locations in the error vector a threshold percentage of a time based on a raw bit error rate supported by the decoder.

In Example 5, the subject matter of Examples 1-4 and 6-11 can optionally include that the decoder comprises a bit-flip (BF) decoder to flip values in the codeword to decode to produce a noise-free and zero syndrome codeword with a sparse number of instances of the first value. The BF decoder performs multiple iterations of generating error vectors to move toward a noise free codeword having zero syndrome. Each of the generated error vectors is sent to the compression unit to store the pointers for the bit locations in the generated error vectors having the first value in different rows of memory cells in the decoder memory device.

In Example 6, the subject matter of Examples 1-5 and 7-11 can optionally include that the compression unit stores the pointers in the row of memory cells in the decoder memory device by determining whether there are remaining pointers indicating bit locations in the error vector having the first value not yet stored in the decoder memory device after storing the maximum number of pointers for the error vector in the row of memory cells in the decoder memory device. The remaining pointers are stored in a next row of memory cells in the decoder memory device in response to determining that there are the remaining pointers not yet stored.

In Example 7, the subject matter of Examples 1-6 and 8-11 can optionally include that the compression unit is further to indicate in an overflow register that the next row of memory cells in the decoder memory device following the row of memory cells in which the maximum number of pointers are stored includes further pointers for the error vector.

In Example 8, the subject matter of Examples 1-7 and 9-11 can optionally include that the overflow register is stored in the decoder memory device and has a bit for each row of memory cells in the decoder memory device.

In Example 9, the subject matter of Examples 1-8 and 10-11 can optionally include a decompression unit. The decoder is further to request, from the decompression unit, an error vector stored in the decoder memory device. The decompression unit is further to: receive, from the decoder, the request for the error vector; determine a row of memory cells in the decoder memory device for the requested error vector; and reconstruct the requested error vector to include the first value in each of the bit locations indicated in the pointers in the determined row of memory cells, wherein the bit locations in the requested error vector not identified in the pointers in the determined row of memory cells indicate the second value.

In Example 10, the subject matter of Examples 1-9 and 11 can optionally include that the decompression unit is further to: determine whether a next row of memory cells from the determined row includes pointers for the requested error vector; and indicate in the error vector the first value in each of the bit locations indicated in pointers in the next row for the requested error vector.

In Example 11, the subject matter of Examples 1-10 can optionally include that the decoder memory device comprises a static random access memory (SRAM).

Example 12 is a storage device, comprising: storage units storing codewords; a decoder to decode codewords to produce error vectors used to decode the codewords; a decoder memory device to store the error vectors; and a compression unit. The compression unit is to: receive the error vector from the decoder during decoding of the codeword, wherein each bit in the error vector has one of a first value and a second value; determine at least one bit location in the error vector having the first value; and store at least one pointer in a row of memory cells in the decoder memory device indicating the determined at least one bit location in the codeword having the first value.

In Example 13, the subject matter of Examples 12 and 14-18 can optionally include that the row of memory cells is configured to store a maximum number of pointers to bit locations in the error vector having the first value that is less than a number of bits in the error vector to compress the error vector in the row of memory cells.

In Example 14, the subject matter of Examples 12, 13 and 15-18 can optionally include that the error vector has a sparse number of the first value.

In Example 15, the subject matter of Examples 12-14 and 16-18 can optionally include that the decoder memory device is configured such that the row of memory cells is of sufficient width to store the maximum number of pointers to bit locations in the error vector a threshold percentage of a time based on a raw bit error rate supported by the decoder.

In Example 16, the subject matter of Examples 12-15 and 17-18 can optionally include that the compression unit stores the pointers in the row of memory cells in the decoder memory device. A determination is made as to whether there are remaining pointers indicating bit locations in the error vector having the first value not yet stored in the decoder memory device after storing the maximum number of pointers for the error vector in the row of memory cells in the decoder memory device. The remaining pointers are stored in a next row of memory cells in the decoder memory device in response to determining that there are the remaining pointers not yet stored.

In Example 17, the subject matter of Examples 12-16 and 18 can optionally include a decompression unit. The decoder further requests, from the decompression unit, an error vector stored in the decoder memory device. The decompression unit is further to receive, from the decoder, the request for the error vector, determine a row of memory cells in the decoder memory device for the requested error vector, and reconstruct the requested error vector to include the first value in each of the bit locations indicated in the pointers in the determined row of memory cells, wherein the bit locations in the requested error vector not identified in the pointers in the determined row of memory cells indicate the second value.

In Example 18, the subject matter of Examples 12-17 can optionally include that the decompression unit is further to determine whether a next row of memory cells from the determined row includes pointers for the requested error vector and indicate in the error vector the first value in each of the bit locations indicated in pointers in the next row for the requested error vector.

Example 19 is a method for decoding data. Codewords are decoded to produce error vectors used to decode the codewords. The error vectors are stored in a decoder memory device. The error vector is received from the decoder during decoding of the codeword, wherein each bit in the error vector has one of a first value and a second value. A determination is made of at least one bit location in the error vector having the first value. At least one pointer is stored in a row of memory cells in the decoder memory device indicating the determined at least one bit location in the codeword having the first value.

In Example 20, the subject matter of Examples 19 and 21-25 can optionally include that the row of memory cells is configured to store a maximum number of pointers to bit locations in the error vector having the first value that is less than a number of bits in the error vector to compress the error vector in the row of memory cells.

In Example 21, the subject matter of Examples 19, 20 and 22-25 can optionally include that the error vector has a sparse number of the first value.

In Example 22, the subject matter of Examples 19-21 and 23-25 can optionally include that the decoder memory device is configured such that the row of memory cells is of sufficient width to store the maximum number of pointers to bit locations in the error vector a threshold percentage of a time based on a raw bit error rate supported by the decoder.

In Example 23, the subject matter of Examples 19-22 and 24-25 can optionally include that the storing the pointers in the row of memory cells in the decoder memory device further comprises determining whether there are remaining pointers indicating bit locations in the error vector having the first value not yet stored in the decoder memory device after storing the maximum number of pointers for the error vector in the row of memory cells in the decoder memory device and storing the remaining pointers in a next row of memory cells in the decoder memory device in response to determining that there are the remaining pointers not yet stored.

In Example 24, the subject matter of Examples 19-23 and 25 can optionally include: requesting an error vector stored in the decoder memory device; receiving the request for the error vector; determining a row of memory cells in the decoder memory device for the requested error vector; and reconstructing the requested error vector to include the first value in each of the bit locations indicated in the pointers in the determined row of memory cells, wherein the bit locations in the requested error vector not identified in the pointers in the determined row of memory cells indicate the second value.

In Example 25, the subject matter of Examples 19-24 can optionally include determining whether a next row of memory cells from the determined row includes pointers for the requested error vector and indicating in the error vector the first value in each of the bit locations indicated in pointers in the next row for the requested error vector.

What is claimed:

1. An apparatus for decoding data, comprising:
   a decoder to decode codewords to produce error vectors used to decode the codewords;
   a decoder memory device to store the error vectors; and
   a compression unit to:
      receive an error vector from the decoder during decoding of a codeword, wherein each bit in the error vector has one of a first value and a second value;
      determine at least one bit location in the error vector having the first value; and
      store at least one pointer in a row of memory cells in the decoder memory device indicating the determined at least one bit location in the codeword having the first value.

2. The apparatus of claim 1, wherein the row of memory cells is configured to store a maximum number of pointers to bit locations in the error vector having the first value that is less than a number of bits in the error vector to compress the error vector in the row of memory cells.

3. The apparatus of claim 2, wherein the error vector has a sparse number of the first value.

4. The apparatus of claim 3, wherein the decoder memory device is configured such that the row of memory cells is of sufficient width to store the maximum number of pointers to bit locations in the error vector a threshold percentage of a time based on a raw bit error rate supported by the decoder.

5. The apparatus of claim 4, wherein the decoder comprises a bit-flip (BF) decoder to flip values in the codeword to decode to produce a noise-free and zero syndrome codeword with a sparse number of instances of the first value, wherein the BF decoder performs multiple iterations of generating error vectors to move toward a noise free codeword having zero syndrome, wherein each of the generated error vectors is sent to the compression unit to store the pointers for the bit locations in the generated error vectors having the first value in different rows of memory cells in the decoder memory device.

6. The apparatus of claim 2, wherein the compression unit stores the pointers in the row of memory cells in the decoder memory device by further:
   determine whether there are remaining pointers indicating bit locations in the error vector having the first value not yet stored in the decoder memory device after storing the maximum number of pointers for the error vector in the row of memory cells in the decoder memory device; and
   store the remaining pointers in a next row of memory cells in the decoder memory device in response to determining that there are the remaining pointers not yet stored.

7. The apparatus of claim 6, wherein the compression unit is further to:
   indicate in an overflow register that the next row of memory cells in the decoder memory device following the row of memory cells in which the maximum number of pointers are stored includes further pointers for the error vector.

8. The apparatus of claim 7, wherein the overflow register is stored in the decoder memory device and has a bit for each row of memory cells in the decoder memory device.

9. The apparatus of claim 1, further comprising:
   a decompression unit;
   wherein the decoder is further to request, from the decompression unit, an error vector stored in the decoder memory device,
   wherein the decompression unit is further to:
      receive, from the decoder, the request for the error vector;
      determine a row of memory cells in the decoder memory device for the requested error vector; and
      reconstruct the requested error vector to include the first value in each of the bit locations indicated in the pointers in the determined row of memory cells, wherein bit locations in the requested error vector not identified in the pointers in the determined row of memory cells indicate the second value.

10. The apparatus of claim 9, wherein the decompression unit is further to:
    determine whether a next row of memory cells from the determined row includes pointers for the requested error vector; and
    indicate in the error vector the first value in the bit locations indicated in pointers in the next row for the requested error vector.

11. The apparatus of claim 1, wherein the decoder memory device comprises a static random access memory (SRAM).

12. A storage device, comprising:
storage units storing codewords;
a decoder to decode codewords to produce error vectors used to decode the codewords;
a decoder memory device to store the error vectors; and
a compression unit to:
receive an error vector from the decoder during decoding of a codeword, wherein each bit in the error vector has one of a first value and a second value;
determine at least one bit location in the error vector having the first value; and
store at least one pointer in a row of memory cells in the decoder memory device indicating the determined at least one bit location in the codeword having the first value.

13. The storage device of claim 12, wherein the row of memory cells is configured to store a maximum number of pointers to bit locations in the error vector having the first value that is less than a number of bits in the error vector to compress the error vector in the row of memory cells.

14. The storage device of claim 13, wherein the error vector has a sparse number of the first value.

15. The storage device of claim 14, wherein the decoder memory device is configured such that the row of memory cells is of sufficient width to store the maximum number of pointers to bit locations in the error vector a threshold percentage of a time based on a raw bit error rate supported by the decoder.

16. The storage device of claim 13, wherein the compression unit stores the pointers in the row of memory cells in the decoder memory device by further:
determine whether there are remaining pointers indicating bit locations in the error vector having the first value not yet stored in the decoder memory device after storing the maximum number of pointers for the error vector in the row of memory cells in the decoder memory device; and
store the remaining pointers in a next row of memory cells in the decoder memory device in response to determining that there are the remaining pointers not yet stored.

17. The storage device of claim 12, further comprising:
a decompression unit;
wherein the decoder is further to request, from the decompression unit, an error vector stored in the decoder memory device,
wherein the decompression unit is further to:
receive, from the decoder, the request for the error vector;
determine a row of memory cells in the decoder memory device for the requested error vector; and
reconstruct the requested error vector to include the first value in bit locations indicated in the pointers in the determined row of memory cells, wherein bit locations in the requested error vector not identified in the pointers in the determined row of memory cells indicate the second value.

18. The storage device of claim 17, wherein the decompression unit is further to:
determine whether a next row of memory cells from the determined row includes pointers for the requested error vector; and
indicate in the error vector the first value in the bit locations indicated in pointers in the next row for the requested error vector.

19. A method for decoding data, comprising:
decoding codewords to produce error vectors used to decode the codewords;
storing the error vectors in a decoder memory device;
receiving an error vector from the decoder during decoding of a codeword, wherein each bit in the error vector has one of a first value and a second value;
determining at least one bit location in the error vector having the first value; and
storing at least one pointer in a row of memory cells in the decoder memory device indicating the determined at least one bit location in the codeword having the first value.

20. The method of claim 19, wherein the row of memory cells is configured to store a maximum number of pointers to bit locations in the error vector having the first value that is less than a number of bits in the error vector to compress the error vector in the row of memory cells.

21. The method of claim 20, wherein the error vector has a sparse number of the first value.

22. The method of claim 21, wherein the decoder memory device is configured such that the row of memory cells is of sufficient width to store the maximum number of pointers to bit locations in the error vector a threshold percentage of a time based on a raw bit error rate supported by the decoder.

23. The method of claim 20, wherein the storing the pointers in the row of memory cells in the decoder memory device further comprises:
determining whether there are remaining pointers indicating bit locations in the error vector having the first value not yet stored in the decoder memory device after storing the maximum number of pointers for the error vector in the row of memory cells in the decoder memory device; and
storing the remaining pointers in a next row of memory cells in the decoder memory device in response to determining that there are the remaining pointers not yet stored.

24. The method of claim 19, further comprising:
requesting an error vector stored in the decoder memory device;
receiving the request for the error vector;
determining a row of memory cells in the decoder memory device for the requested error vector; and
reconstructing the requested error vector to include the first value in bit locations indicated in the pointers in the determined row of memory cells, wherein bit locations in the requested error vector not identified in the pointers in the determined row of memory cells indicate the second value.

25. The method of claim 24, further comprising:
determining whether a next row of memory cells from the determined row includes pointers for the requested error vector; and
indicating in the error vector the first value in the bit locations indicated in pointers in the next row for the requested error vector.

* * * * *